United States Patent
Manganaro et al.

(10) Patent No.: US 10,848,169 B2
(45) Date of Patent: Nov. 24, 2020

(54) RECEIVER SIGNAL CHAINS WITH LOW POWER DRIVERS AND DRIVER OPTIMIZATION

(71) Applicant: Analog Devices, Inc., Norwood, MA (US)

(72) Inventors: Gabriele Manganaro, Winchester, MA (US); Nevena Rakuljic, San Diego, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/359,843

(22) Filed: Mar. 20, 2019

(65) Prior Publication Data

US 2020/0304135 A1   Sep. 24, 2020

(51) Int. Cl.
  *H03M 1/10* (2006.01)
  *H03F 1/32* (2006.01)
  *H03M 1/06* (2006.01)

(52) U.S. Cl.
  CPC ........ *H03M 1/1071* (2013.01); *H03F 1/3241* (2013.01); *H03M 1/069* (2013.01); *H03M 1/0626* (2013.01)

(58) Field of Classification Search
  CPC .. H03M 1/1071; H03M 1/0626; H03M 1/069; H03F 1/3241
  USPC .................................................. 341/120, 155
  See application file for complete search history.

(56) References Cited

U.S. PATENT DOCUMENTS

| 5,168,459 | A | 12/1992 | Hiller |
| 6,809,589 | B2 | 10/2004 | Manganaro |
| 7,015,851 | B1 | 3/2006 | Bruhns et al. |
| 7,253,755 | B1* | 8/2007 | Fette ............... H03M 1/185 341/118 |
| 7,330,141 | B2 | 2/2008 | Temerinac et al. |
| 7,420,490 | B2* | 9/2008 | Gupta ............... G11O 27/026 341/122 |

(Continued)

FOREIGN PATENT DOCUMENTS

WO   2015/089090   6/2015

OTHER PUBLICATIONS

Murmann, *Digitally Assisted Data Converter Design*, 978-1-4799-0645/1/13 © 2013 IEEE, 8 pages.

(Continued)

*Primary Examiner* — Khai M Nguyen
(74) *Attorney, Agent, or Firm* — Patent Capital Group

(57) ABSTRACT

Non-idealities of input circuitry of a receiver signal chain can significantly degrade the overall performance of the receiver signal chain. To meet high performance requirements, the input circuitry is typically implemented with power hungry circuitry in a different semiconductor technology from the analog-to-digital converter that the input circuitry is driving. With suitable optimization techniques, performance requirements on the input circuitry can be reduced while meeting target performance of the receiver signal chain. Specifically, optimization techniques can compensate for input frequency-dependent properties and/or amplitude-dependent properties of the input circuitry. In some cases, reducing performance requirements on the input circuitry means that the input circuitry can be implemented in the same semiconductor technology as the analog-to-digital converter.

31 Claims, 12 Drawing Sheets

(56) References Cited

U.S. PATENT DOCUMENTS

| | | | |
|---|---|---|---|
| 7,834,703 B2* | 11/2010 | Ganeshan | H03F 1/223 330/117 |
| 8,063,811 B2 | 11/2011 | Hojabri et al. | |
| 8,410,960 B2 | 4/2013 | Hekstra et al. | |
| 8,427,175 B2 | 4/2013 | Kidambi | |
| 8,536,947 B2* | 9/2013 | Wang | H03F 3/45183 330/255 |
| 8,644,437 B2 | 2/2014 | Kim et al. | |
| 8,723,707 B2 | 5/2014 | Ali | |
| 8,825,415 B2 | 9/2014 | Johansson | |
| 9,154,146 B1 | 10/2015 | Chiu et al. | |
| 9,461,660 B2 | 10/2016 | Muhammad et al. | |
| 9,564,876 B2 | 2/2017 | Kim et al. | |
| 9,584,146 B2 | 2/2017 | Op et al. | |
| 9,590,668 B1 | 3/2017 | Kim et al. | |
| 9,935,645 B1 | 4/2018 | Tangudu et al. | |
| 1,005,063 A1 | 8/2018 | Tangudu et al. | |
| 10,050,636 B2* | 8/2018 | Tangudu | H03M 1/1245 |
| 1,034,093 A1 | 7/2019 | Rakuljic et al. | |
| 2005/0219088 A1 | 10/2005 | Batruni | |
| 2006/0273942 A1 | 12/2006 | Koste et al. | |
| 2009/0058521 A1 | 3/2009 | Fernandez | |
| 2012/0176191 A1 | 7/2012 | Kim et al. | |
| 2013/0208776 A1* | 8/2013 | Svensson | H04B 17/0085 375/224 |
| 2015/0032788 A1 | 1/2015 | Velazquez et al. | |
| 2016/0087604 A1 | 3/2016 | Kim et al. | |
| 2018/0076808 A1 | 3/2018 | Singer | |

OTHER PUBLICATIONS

Devarajan et al., *A 12-b 10-GS/s Interleaved Pipeline ADC in 28-nm CMOS Technology*, IEEE Journal of Solid-State Circuits, vol. 52, No. 20, Dec. 2017, 15 pages.

Rakuljic et al., *In-situ nonlinear calibration of a RF signal chain*, 978-1-5386-4881-0/18 © 2018 IEEE, 5 pages.

Kenney et al., *An Enhanced Slew Rate Source Follower*, IEEE Journal of Solid-State Circuits, vol. 30, No. 2, Feb. 1995, 3 pages.

Taft et al., *A 1.8 V 1.0 GS/s 10b Self-Calibrating Unified-Folding-Interpolating ADC with 9.1 ENOB at Nyquist Frequency*, IEEE Journal of Solid-State Circuits, vol. 44, No. 12, Dec. 2009, 11 pages.

Ali et al., *A 14 Bit 1 GS/s RF Sampling Pipelined ADC with Background Calibration*, IEEE Journal of Solid-State Circuits, vol. 49, No. 12, Dec. 2014, 11 pages.

Yang Yang et al., *Linearization of ADCs via Digital Post Processing*, 978-1-4244-9474-3/11 © 2011 IEEE, 4 pages.

John Tsimbinos et al., *Input Nyquist Sampling Suffices to Identify and Compensate Nonlinear Systems*, IEEE Transactions on Signal Processing, vol. 46, No. 10, Oct. 1998, 1053-587-X/98 © 1998 IEEE, 5 pages.

Ifiok Umoh et al., *A 0.18μm CMOS Narrow-band LNA Linearization using Digital Base-band Post-Distortion*, 978-1-4244-9721-8/10 © 2010 IEEE, 4 pages.

Kutluyil Doğançay, *LMS Algorithm for Blind Adaptive Nonlinear Compensation*, School of Electrical and Information Engineering, University of South Australia, Downloaded on Mar. 2, 2009, 6 pages.

Kutluyil Doğançay, *Blind Compensation of Nonlinear Distortion for Bandlimited Signals*, IEEE Transactions on Circuits and Systems—I: Regular Papers, vol. 52, No. 9, Sep. 2005, 11 pages.

Mikko Valkama et al., *Advanced Digital Signal Processing Techniques for Compensation of Nonlinear Distortion in Wideband Multicarrier Radio Receivers*, IEEE Transactions on Microwave Theory and Techniques, vol. 54, No. 6, Jun. 2006, 11 pages.

John A. McNeill et al., *"Split ADC" Background Linearization of VCO-Based ADCs*, IEEE Transactions on Circuits and Systems—I: Regular Papers, vol. 62, No. 1, Jan. 2015, 10 pages.

Gert Cauwenberghs et al., *Adaptive Digital Correction of Analog Errors in MASH ADC's—Part I: Off-Line and Blind On-Line Calibration*, IEEE Transactions on Circuits and Systems—II: Analog and Digital Signal Processing, vol. 47, No. 7, Jul. 2000, 8 pages.

Péter Kiss et al., *Adaptive Digital Correction of Analog Errors in MASH ADCs—Part II: Correction Using Test-Signal Injection*, IEEE Transactions on Circuits and Systems—II: Analog and Digital Processing, vol. 47, No. 7, Jul. 2000, 9 pages.

Tsimbinos et al., *Improved State-Space and Phase-Plane Error Table Compensation of Analogue-to-Digital Converters Using Pseudo-Random Calibration Signals*, Advanced A-D and D-A Conversion Techniques and their Applications, Jul. 6-8, 1994, Conference Publication No. 393, © IEEE 1994.

Razavi et al., *Principles of Data Conversion System Design*, IEEE Press, Piscataway, NJ, 0-783-1093-4, 1995, 8 pages.

Dunn et al., *Wideband Digital Predistortion of Solid-State Radar Amplifiers*, IEEE Transactions on Aerospace and Electronic Systems, vol. 42, No. 5, Oct. 2016, 15 pages.

De Office Action issued in 10 2018 131 959.2 dated Oct. 18, 2019, 16 pages.

* cited by examiner

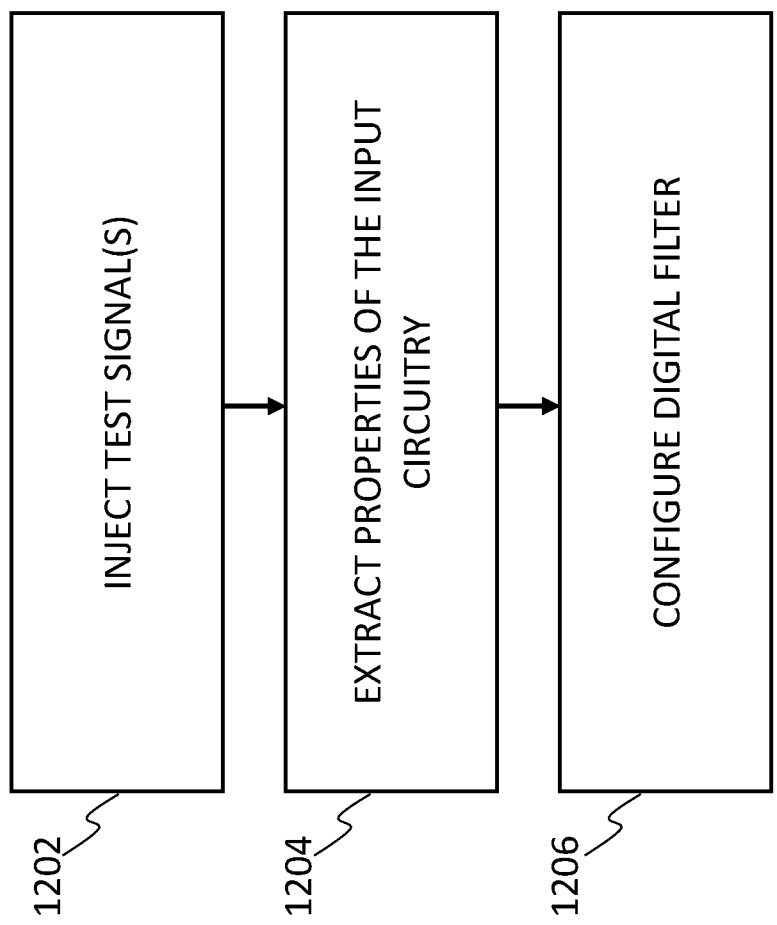

RECEIVER SIGNAL CHAINS WITH LOW POWER DRIVERS AND DRIVER OPTIMIZATION

FIELD OF THE DISCLOSURE

The present invention relates to the field of integrated circuits, in particular to receiver signal chains with better integration and less power consumption.

BACKGROUND

In many electronics applications, an analog input signal is converted to a digital output signal (e.g., for further digital signal processing). For instance, an antenna generates an analog signal based on the electromagnetic waves carrying information/signals in the air. The analog signal generated by the antenna is then provided as input to an analog-to-digital converter (ADC) to generate a digital output signal for further processing.

ADCs convert a continuous physical quantity that is also known as an analog signal to a digital signal whose values represent the quantity's amplitude (or to a digital signal carrying that digital number). One critical limitation to the performance of an ADC is the linearity of the overall system, or the linearity of the receiver signal chain. Linearity can, for example, affect the signal-to-noise-and-distortion ratio (SINAD) and spurious free dynamic range (SFDR). In some cases, circuit designers achieve better linearity at the cost of implementing more complex and/or power hungry circuit designs, especially for the circuits which drive the ADC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 12 is a flow diagram illustrating a method for optimizing a receiver signal chain, according to some embodiments of the disclosure.

DETAILED DESCRIPTION

Overview

Figure 1:
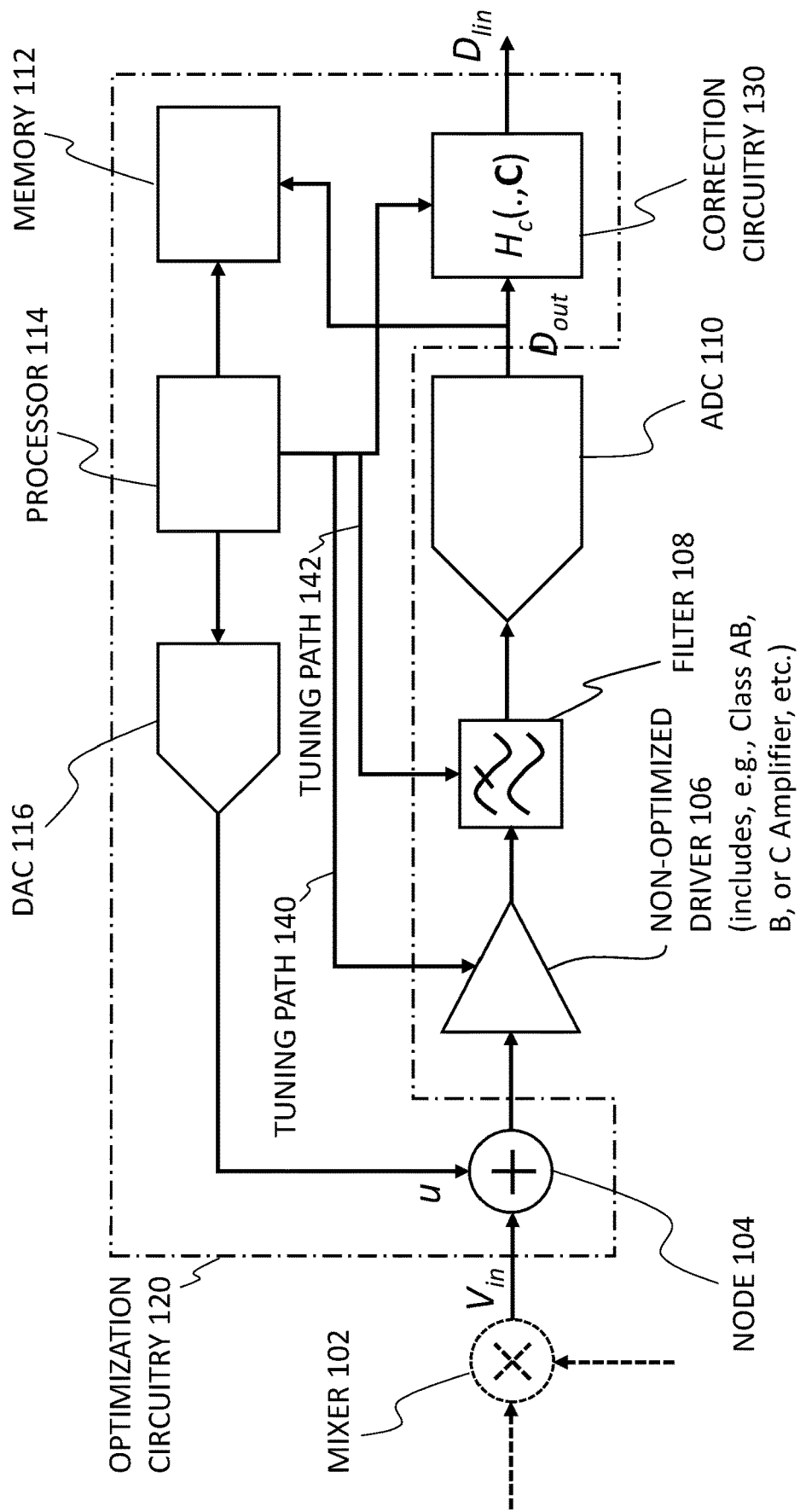
FIG. 1 illustrates an exemplary receiver signal chain with digitally-assisted optimization, according to some embodiments of the disclosure.

Non-idealities of input circuitry of a receiver signal chain can significantly degrade the overall performance of the receiver signal chain. To meet high performance requirements, the input circuitry is typically implemented with power hungry circuitry in a different semiconductor technology from the analog-to-digital converter that the input circuitry is driving. With suitable optimization techniques, performance requirements on the input circuitry can be reduced while meeting target performance of the receiver signal chain. Specifically, optimization techniques can compensate for input frequency-dependent properties and/or amplitude-dependent properties of the input circuitry. In some cases, reducing performance requirements on the input circuitry means that the input circuitry can be implemented in the same semiconductor technology as the analog-to-digital converter.

Design Considerations for Input Circuitry Driving ADCs

A receiver signal chain typically has a contiguous chain of function blocks (the ADC being one of the function blocks). For instance, receiver signal chain can include a mixer, input circuitry (such as a driving amplifier), a filter (e.g., anti-aliasing filter), and an ADC. The overall noise and linearity of signal chain performance are determined by the combination of the dynamic performance of each functional block. This means that the input circuitry noise and linearity performance are often specified to be comparable, or possibly higher than the ADC's performance. In other words, specifications for noise and linearity performance of the input circuitry can often be just as high as the ADCs' noise and linearity specifications, and in some cases possibly higher, so as not to limit the performance of the overall signal chain they are embedded into. As a result, the power consumption of the input circuitry can be as high as the ADC's power consumption.

High speed ADCs with switched-capacitor front-end (sampling) circuitry can be particularly challenging to drive. This means that the ADCs can require high performance input circuitry to drive the ADCs. Pipelined ADCs and time-interleaved pipelined ADCs with switched-capacitor front-ends are examples of ADCs which can require high performance input circuitry. The high performance input circuitry can include an optimized driving amplifier or driver implemented to supply an input signal to be converted by an ADC, and the input signal is provided to the ADCs' analog front-end (sampling) circuitry. The optimized driving amplifier or driver can be designed to meet the specifications of the overall receiver signal chain. For instance, an optimized driver can include a low noise, high linearity amplifier that meets high dynamic performance requirements imposed on the receiver signal chain.

Often, circuit designers would implement the high performance, optimized input circuitry in specific semiconductor technologies/processes and/or power hungry circuit architectures to reduce the non-idealities of the input circuitry as much as possible. In particular, Class A amplifiers are generally used to drive such high performance ADCs, even though these amplifier architectures have the highest power consumption and lowest power efficiency. For instance, high performance complementary metal-oxide-semiconductor (CMOS) ADCs are often driven by input circuitry having optimized, high linearity, low noise, Class A driving amplifiers. The Class A driving amplifiers often (a) consume power that is comparable with the ADC, and/or (b) are realized on a separate BiCMOS chip, BiCMOS being a semiconductor process/technology that combines bipolar junction transistors (BJTs) and CMOS transistors. Neither (a) nor (b) are highly desirable from power efficiency and complexity points of view. In such Class A driving amplifiers, BJTs serving as input pairs provide very high gain and high linearity over a large signal bandwidth. However, these architectures require larger supplies than most nanometer CMOS ADCs and large quiescent currents due to their Class A operation. In many practical cases, the power consumption for such driving amplifiers is close to a Watt. Moreover, high performance "signal BJTs" are not available in CMOS processes, particularly on the some process nodes using Fin field-effect transistors (FinFETs). Therefore, driving amplifiers requiring BJTs are not amenable to integration with the CMOS data converters.

Saving Power and Reducing Complexity in the Receiver Signal Chain while Meeting Overall Target Performance Requirements Through Digitally-Assisted Optimization To address issues of power efficiency and complexity, the receiver signal chain can, instead of implementing optimized drivers in the input circuitry, implement non-optimized drivers in the input circuitry that is driving high speed ADCs. Using a non-optimized driver can save power and reduce complexity. The non-optimized drivers can be implemented using more power efficient amplifier circuit architectures (e.g., consuming a fraction of the power from other circuit architectures), or more architecturally desirable amplifier circuit architectures. The non-optimized drivers are not themselves designed, implemented, and/or optimized to meet target performance requirements imposed on the receiver signal chain. The non-optimized drivers have non-idealities, such as dynamic non-linearities, which can significantly degrade performance of the receiver signal chain. To address the deficiencies in performance, a digitally-assisted optimization technique extracts and compensates for the non-idealities of the input circuitry so that the overall receiver signal chain can meet rigorous target performance requirements.

FIG. 1 illustrates an exemplary receiver signal chain with digitally-assisted optimization, according to some embodiments of the disclosure. A receiver signal chain can include a receiver element, such as an antenna, or sensing element, which generates an analog signal to be digitized and processed by the rest of the receiver signal chain. Depending on the architecture of the receiver signal chain, a mixer 102 can be included to convert the analog signal to a different frequency (e.g., lower frequency). In the example shown, the receiver signal chain has input circuitry to receive an input signal (e.g., the analog signal or a derivation of the analog signal), and an ADC 110 downstream of the input circuitry to perform digitization. Digitization by ADC 110 generates a digital output, and digital processing can be performed on the digital output. The input circuitry drives the ADC 110. The input circuitry, as used herein, refers to circuitry in front of and/or up to the analog front-end (sampling) circuitry of ADC 110, which can include components such as a driving amplifier or driver, a filter, a mixer, and interconnects between components of the input circuitry and the analog front-end (sampling) circuitry of ADC 110. In this example shown, the input circuitry includes a non-optimized driver 106 to receive the input signal. The non-optimized driver 106 has non-idealities that could cause the receiver signal chain to not meet target performance requirements if the non-idealities are left uncompensated. In some cases, the input circuitry includes a filter 108 (e.g., anti-aliasing filter) between the non-optimized driver 106 and ADC 110.

Instead of using a power hungry Class A amplifier, e.g., a Class A driving amplifier implemented in BiCMOS technology, the non-optimized driver 106 includes and is implemented using a Class AB, Class B, or Class C amplifier. Amplifying transistor devices in Class A amplifier conducts current through a whole period of an input signal, while amplifying transistor devices in Class AB, Class B, and Class C amplifiers conduct current during only a portion of the period of the input signal. Accordingly, circuit implementations of Class AB, Class B, or Class C amplifiers consume much less current and power than Class A amplifiers. However, the non-optimized driver 106 adds non-idealities to the receiver signal chain. For instance, Class AB, Class B, and Class C amplifiers can have non-linearities that are much more severe than Class A amplifiers. While power consumption can be reduced, e.g., from 1 Watt to 300-200 milliWatts or less (power savings of 700 milliWatts or more), the non-optimized driver 106 adds 6-10 dB in harmonic distortion. The non-idealities of the input circuitry, such as the harmonic distortions introduced by the non-optimized driver 106, are compensated by digitally-assisted optimization, which can be carried out by optimization circuitry 120. Through the use of digitally-assisted optimization, a non-optimized driver 106 can be implemented in a receiver signal chain to save power and reduce complexity of the input circuitry while still meeting performance requirements dictated by the target performance requirements of the receiver signal chain.

Digitally-Assisted Optimization of Input Circuitry

The optimization circuitry 120 includes a node 104 to inject one or more test signals in front of the input circuitry. For instance, node 104 can inject one or more test signals directly in front of the non-optimized driver 106. To optimize the input circuitry, the one or more test signals can be injected in front of a function block that precedes the ADC 110, e.g., at node 104. The node 104 can include a summation node to enable the one or more test signals to be added to an input signal path to the input circuitry. The node 104 can include a switch to couple a signal path having the one or more test signals to an input signal path of the input circuitry. The node 104 can include a switch to decouple the input signal path from the input circuitry. In some cases, node 104 can be located further upstream in the receiver signal chain, such as in front of mixer 102.

The one or more test signals stimulate the receiver signal chain, and measurements/samples can be taken at an output of the ADC 110 (or an output downstream of the ADC 110 in the digital domain), e.g., while the one or more test signals are being injected and processed by the receiver signal chain to estimate the non-idealities of the input circuitry. The measurements/samples can be taken of the output of the ADC 110 (or an output downstream of the ADC 110 in the digital domain), where the output is produced as a result of injecting the one or more test signals.

The optimization circuitry 120 further includes digital circuitry to derive one or more parameters of the input circuitry from samples of an output of the ADC 110, e.g., $D_{out}$, generated from injecting the one or more test signals. The parameters can include linear parameters or properties. The parameters can include non-linear parameters or properties. The parameters can represent non-idealities of the input circuitry. The digital circuitry can include processor 114 and memory 112. Processor 114 include one or more of the following: a processor that executes instructions from memory 112, and specialized digital circuitry configured to carry out processing of the output samples of the ADC 110. The memory 112 can store instructions for the processor 114 and/or output samples of the ADC 110. For example, the one or more test signals can be injected in front of input circuitry that precedes the ADC 110. Output samples of the ADC 110 can be stored in memory 112. Processor 114 (e.g., microcontroller) can estimate the non-idealities of the input circuitry based on the one or more test signals and an output of the signal chain (e.g., samples of the digital output of the ADC 110). In some cases, processor 114 can be implemented with dedicated/specialized digital hardware to carry out some of the functions of the processor 114. In some embodiments, processor 114 is on-chip with the ADC 110. In some embodiments, processor 114 is off-chip.

The optimization circuitry 120 further includes circuitry to optimize the input circuitry based on the one or more parameters. The non-idealities of the input circuitry can be digitally corrected at the output. In some cases, the circuitry comprises correction circuitry 130 downstream of the ADC 110 to digitally correct the output of the ADC $D_{out}$ and to generate a corrected output $D_{lin}$ based on the one or more parameters. The non-idealities of the input circuitry can be calibrated out by tuning the analog circuitry of the input circuitry. In some cases, the optimization circuitry 120 comprises a tuning path 140 to adjust the input circuitry, e.g., non-optimized driver 106, in an analog domain based on the one or more parameters. In some cases, the optimization circuitry comprises a tuning path 142 to adjust the input circuitry, e.g., filter 108, in an analog domain based on the one or more parameters. Filter 108 can be a programmable filter that is adjustable by the optimization circuitry 120 via tuning path 142.

The one or more test signals can be injected in the foreground. Test signal injection in the foreground can be performed under a variety of different scenarios. In some embodiments, the one or more test signals are injected at node 104 while the receiver signal chain has been taken off-line, or during a period of time while the receiver signal chain is off-line. In some embodiments, the one or more test signals are injected during a calibration period. In some embodiments, the one or more test signals are injected during a testing period. In some embodiments, the one or more test signals are injected during a period of time when an input signal to the input circuitry is not present (the input signal being a signal that the receiver signal chain receives and processes during normal operation). In some embodiments, the one or more test signals are injected when there is no input signal content going into the input circuitry, or after it has been detected that there is no input signal content going into the input circuitry. In some embodiments, the one or more test signals are injected when the input circuitry is not receiving or processing the input signal. In some embodiments, the one or more test signals are injected when the input signal is removed from an input signal path to the input circuitry. In some embodiments, the one or more test signals are injected when an input signal path to receive the input signal is decoupled from the input circuitry. In some embodiments, the one or more test signals are injected when a signal path having the one or more test signals is coupled to an input signal path of the input circuitry. In some embodiments, the one or more test signals are injected during a period of time when the one or more test signals are not interfering with the input signal. In some embodiments, the one or more test signals are injected during a period of time when the input signal is (or is detected/determined to be) occupying a part of a frequency spectrum that does not overlap with the frequencies of the one or more test signals.

The one or more test signals can be generated in a variety of ways. In some embodiments, the optimization circuitry 120 includes on-chip circuitry that can generate the one or more test signals. In some embodiments, the optimization circuitry 120 includes off-chip circuitry that can generate the one or more test signals. In some embodiments, the optimization circuitry 120 includes a digital-to-analog converter (DAC) 116. DAC 116 can be on-chip or off-chip. In one example, DAC 116 to generate the one or more test signals can be in a same chip package as the non-optimized driver 106 and the ADC 110. In another example, DAC 116 to generate the one or more test signals can be implemented on a same substrate as the non-optimized driver 106 and the ADC 110. Processor 114 can control DAC 116 by providing one or more test signal in digital form to DAC 116, and DAC 116 can synthesize and output the one or more test signals in analog form. In some embodiments, the optimization circuitry includes a signal generator to generate the one or more test signals. For example, an oscillator can be used to generate tones as the one or more test signals. The signal generator can be on-chip or off-chip.

Depending on the scheme implemented by the optimization circuitry 120, the one or more test signals being injected can differ from one scheme to another scheme. In some embodiments, the one or more test signals comprises tones having respective frequencies spread across a range of frequencies. In some embodiments, the one or more test signals comprises a wideband signal spread across a range of frequencies.

Extracting and Compensating for Input Frequency-Dependent and Amplitude-Dependent Properties As discussed previously with FIG. 1, optimization circuitry 120 can extract and compensate for the non-idealities of the input circuitry. The following passages describe illustrative examples of how to extract and compensate for the non-idealities in greater detail. Implementation of the optimization circuitry 120 to extract and compensate for the one or more parameters of the input circuitry is not trivial. The implementation is distinguishable from, and is more advantageous than other optimization schemes. Specifically, the optimization circuitry 120 can extract and compensate for properties of the input circuitry such as input frequency-dependent properties and amplitude-dependent properties. Specifically, input frequency-dependent properties refer to properties or coefficients that vary based on a non-constant or non-linear function of input frequency. Amplitude-dependent properties refer to properties or coefficients that vary based on a non-constant or non-linear function of input amplitude. Amplitude-dependent properties can include gain compression. In some contexts, these input frequency-dependent properties and amplitude-dependent properties are referred to as dynamic non-linearities. Dynamic non-linearities can be particularly difficult to model and extract. The optimization circuitry 120 can extract and compensate for dynamic non-linearities over a wide range of input frequencies. Accordingly, various embodiments described herein can be particularly beneficial in contexts involving wideband input signals in the giga-Hertz range, such as communications and instrumentation.

Once properties of the input circuitry are extracted, the optimization circuitry 120 can compensate for the properties of the input circuitry and improve the overall performance of receiver signal chain. Accordingly, the optimization circuitry 120 allows a non-optimized driver 106 to be used, even though the non-optimized driver 106 cannot meet the target performance requirements of the receiver signal chain. Moreover, the optimization circuitry 120 can improve the performance of the overall receiver signal chain, and compensate for other causes of degradation in performance that arise when the functional blocks of the receiver signal chain are connected together.

In some embodiments, the optimization circuitry 120 uses a model H(.) to model the input circuitry, where the model H(.) represents non-idealities of the input circuitry, and a further model $H_c(.,C)$ to represent an inverse function of H(.). Effectively, $H_c(.,C)$ can reverse the non-idealities and undesirable properties of the input circuitry. Parameters C capturing the non-idealities of the input circuitry (e.g., distortions, dynamic non-linearities, etc.) are initially unknown.

In the foreground, e.g., before the receiver signal chain is used for signal processing, a known analog stimulus signal u as the one or more test signals is applied in front of the input circuitry, e.g., at node 104 (such as at the input of the non-optimized driver 106). The digital output of the ADC 110 ($D_{out}$) is used to determine the model parameters C. Memory 112 can be used to capture samples of the digital output of the ADC 110. Processor 114 or other suitable digital circuitry can extract one or more of: input frequency-dependent properties (e.g., properties that vary based on a non-constant or non-linear function of input signal frequency) of the input circuitry and amplitude-dependent properties (e.g., properties that vary based on a non-constant or non-linear function of input signal amplitude) of the input circuitry, based on samples of an output of the ADC 110. The extracted properties of the input circuitry can be used to determine the model parameters C, which can be used in $H_c(.,C)$ to correct for the non-idealities of the input circuitry.

Once C is determined, the stimulus u is removed. The input signal $V_{in}$ (desired input signal) is applied to the input circuitry and the resulting ADC's digital output $D_{out}$ is digitally distorted based on the model $H_c(.,C)$. Specifically, the digital output $D_{out}$ is digitally post-distorted by applying the model $H_c(.,C)$ to the digital output $D_{out}$ to correct for the non-idealities of the input circuitry. The model $H_c(.,C)$ can be implemented as a digital filter in correction circuitry 130 downstream of the ADC 110 to compensate for non-idealities in the input circuitry, based on the one or more of: input frequency-dependent properties (e.g., properties that vary based on a non-constant or non-linear function of input signal frequency) of the input circuitry and amplitude-dependent properties (e.g., properties that vary based on a non-constant or non-linear function of input signal amplitude) of the input circuitry. The resulting digital output $D_{lin}$ is a digital version of $V_{in}$ with compensation for non-idealities in the input circuitry:

$$D_{lin}=H_c(D_{out})=H_c(H(v_{in}))=Gv_{in}+D_0$$

The models H(.) and $H_c(.)$ can be Hammerstein models, which can include parallel processing branches having a static non-linear element followed by a dynamic linear element.

The one or more test signals serving as the stimulus u, can exercise the input circuitry in a way to expose non-idealities of the input circuitry and allow model parameters C to be estimated. Examples of suitable test signals include: single-tones at evenly spaced frequencies spread over one or more Nyquist zones or other suitable ranges of frequencies, dual-tones/multi-tones at evenly spaced frequencies spread over one or more Nyquist zones or other suitable ranges of frequencies, and wideband signal (e.g., bandlimited, wideband pseudo-random sequences).

In some embodiments, when tones are injected as the one or more test signals, magnitude and phase information of the input circuitry at various frequencies (i.e., information representing the frequency response of the input circuitry) can be extracted and used as part of model parameters C by observing magnitude and phase information of fundamental tones and harmonics in the samples of the digital output of the ADC 110, $D_{out}$. Non-idealities such as input frequency-dependent and amplitude-dependent properties of the input circuitry are expressed in the fundamental tones and harmonics observable in the digital output of the ADC 110, $D_{out}$. Phrased differently, by observing the magnitude and phase information of fundamental tones and harmonics in the samples of the digital output of the ADC 110, it is possible to derive/estimate the input frequency-dependent and amplitude-dependent properties of the input circuitry (e.g., information representing transfer function of the input circuitry and the inverse transfer function of the input circuitry).

In some embodiments, when a wideband signal is injected as the one or more test signals, non-idealities such as input frequency-dependent and amplitude-dependent properties of the input circuitry are expressed in an error signal e[n] observable from the digital output of the ADC 110, $D_{out}$. Specifically, an error signal e[n] can be formed based on the wideband signal u[n] injected as the one or more test signals and a digital output of the ADC 110, $D_{out}$[n]. Properties of the input circuitry can be derived from the error signal e[n] and the wideband signal u[n].

One advantage of the optimization circuitry 120 is that the optimization circuitry 120 is effective at addressing non-linearities whose nature and characteristics are a non-constant or non-linear function of input signal frequency and input signal amplitude. Specifically, the optimization circuitry 120 can compensate for properties which change or vary as a non-constant or non-linear function of input signal frequency and/or input signal amplitude. The ability to address these properties comes from injecting test signals spanning or spread over a range of frequencies. In some receiver signal chains, the non-idealities of input circuitry (e.g., non-optimized driver 106) are dynamic, and can be dependent on the input frequency and amplitude in a non-constant or non-linear fashion. As such, having an effective scheme to address such dynamic non-idealities can be essential to a high performance receiver signal chain.

Another advantage of the optimization circuitry 120 is that the optimization circuitry 120 can optimize input circuitry in a wide range of receiver signal chain architectures, and does not require certain features in the receiver signal chain. For instance, the optimization circuitry 120 does not require a reference/duplicate signal path for the optimization to converge. Also, the optimization circuitry 120 does not assume that the input circuitry non-idealities are static. The optimization circuitry 120 can extract unknown properties of the input circuitry, e.g., input frequency-dependent properties and/or amplitude-dependent properties, and implement an inverse model efficiently to digitally correct the digital output of the receiver signal chain.

Another advantage of the optimization circuitry 120 is that the optimization circuitry 120 does not require an input signal or a varying input signal to be present. As long as it is possible to inject the one or more test signals in front of the input circuitry, the optimization circuitry 120 can extract and compensate non-idealities of the input circuitry.

Exemplary BiCMOS Non-Optimized Driver Driving a CMOS ADC

Figure 2:
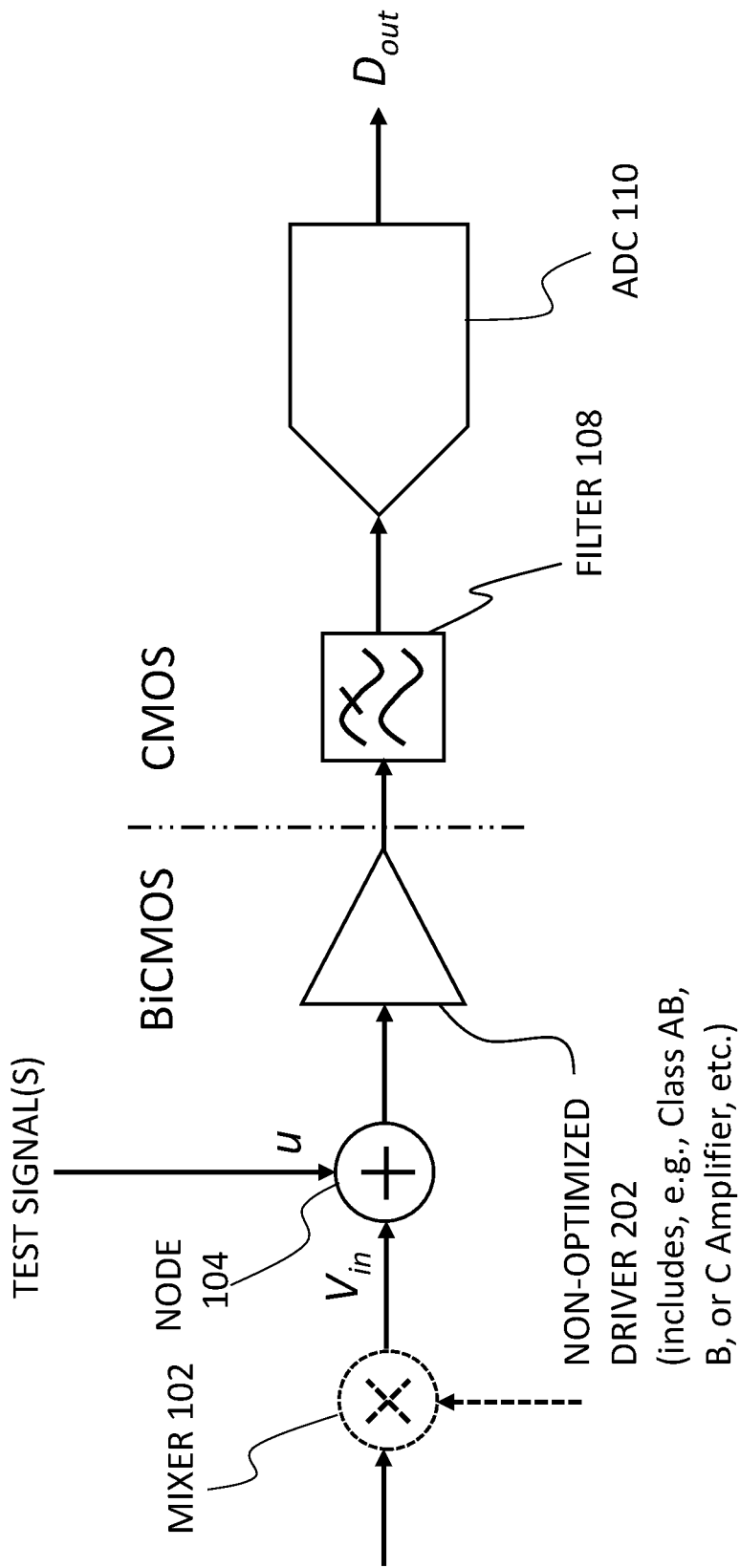
FIG. 2 illustrates an exemplary input circuitry driving an ADC, according to some embodiments of the disclosure.

With optimization circuitry 120, the non-optimized driver 106 can be implemented using more power efficient, but less linear, amplifier architectures such as Class AB, Class B, and Class C amplifiers. FIG. 2 illustrates an exemplary input circuitry driving an ADC 110, according to some embodiments of the disclosure. Node 104 allows one or more test signals to be injected in front of the input circuitry. The input circuitry includes a non-optimized driver 202, which can include a Class AB, Class B, or Class C amplifier. Specifically, the non-optimized driver 202 is fabricated in BiCMOS technology, i.e., a semiconductor technology that integrates BJTs and CMOS transistors on a same die. The input circuitry can further include filter 108, whose output drives ADC 110. At least ADC 110 is fabricated in CMOS technology. Optimization circuitry (not shown fully in the FIGURE) can observe samples of the digital output $D_{out}$ to extract and compensate for properties of the input circuitry, including the non-idealities of the non-optimized driver 202.

Figure 3:
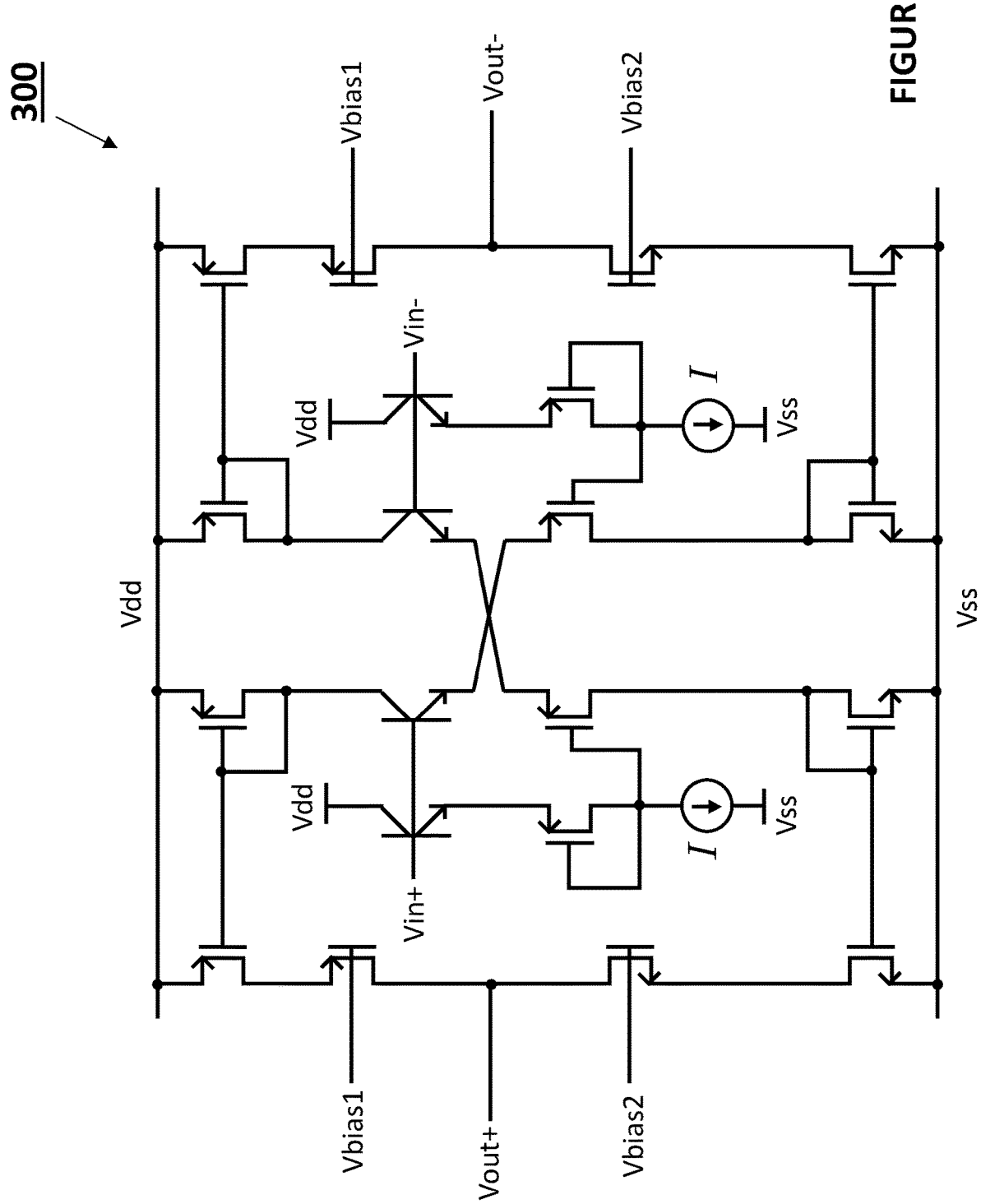
FIG. 3 shows an exemplary non-optimized driver, according to some embodiments of the disclosure.

FIG. 3 shows an exemplary non-optimized driver, according to some embodiments of the disclosure. Specifically, circuit 300 is an exemplary Class AB amplifier having BJTs serving as the input transistor devices while the other transistor devices are CMOS transistors. Circuit 300 can be fabricated in BiCMOS technology.

Replacing Class A amplifier with a Class AB amplifier can reduce the driver power consumption from about 1 Watt to 300-200 milliWatts or less, but at the cost of an increase of 6 to 10 dB in total harmonic distortion. Using a Class AB amplifier as seen in FIG. 3 as the non-optimized driver 202 of FIG. 2 can save power of the order of about 700 mW, possibly more. With optimization circuitry 120 illustrated in FIG. 1, the harmonic distortion of the receiver signal chain can be reduced by 10 dB or more, at the cost digital power on the order of only 100 milliWatts or less for running optimization circuitry 120. The resulting receiver signal chain achieves significantly lower power consumption without suffering from net degradation in linearity and performance.

Enabling Higher Signal Chain Integration where a CMOS Non-Optimized Driver Drives a CMOS ADC As seen in FIG. 2, BiCMOS technology is used to fabricate a BiCMOS non-optimized driver 202 residing on a separate die from a CMOS ADC 110. BiCMOS technology can be more expensive than CMOS technology, and the overall signal chain integrating at least a BiCMOS die with a CMOS die adds complexity and further costs to fabricate the receiver signal chain.

Figure 4:
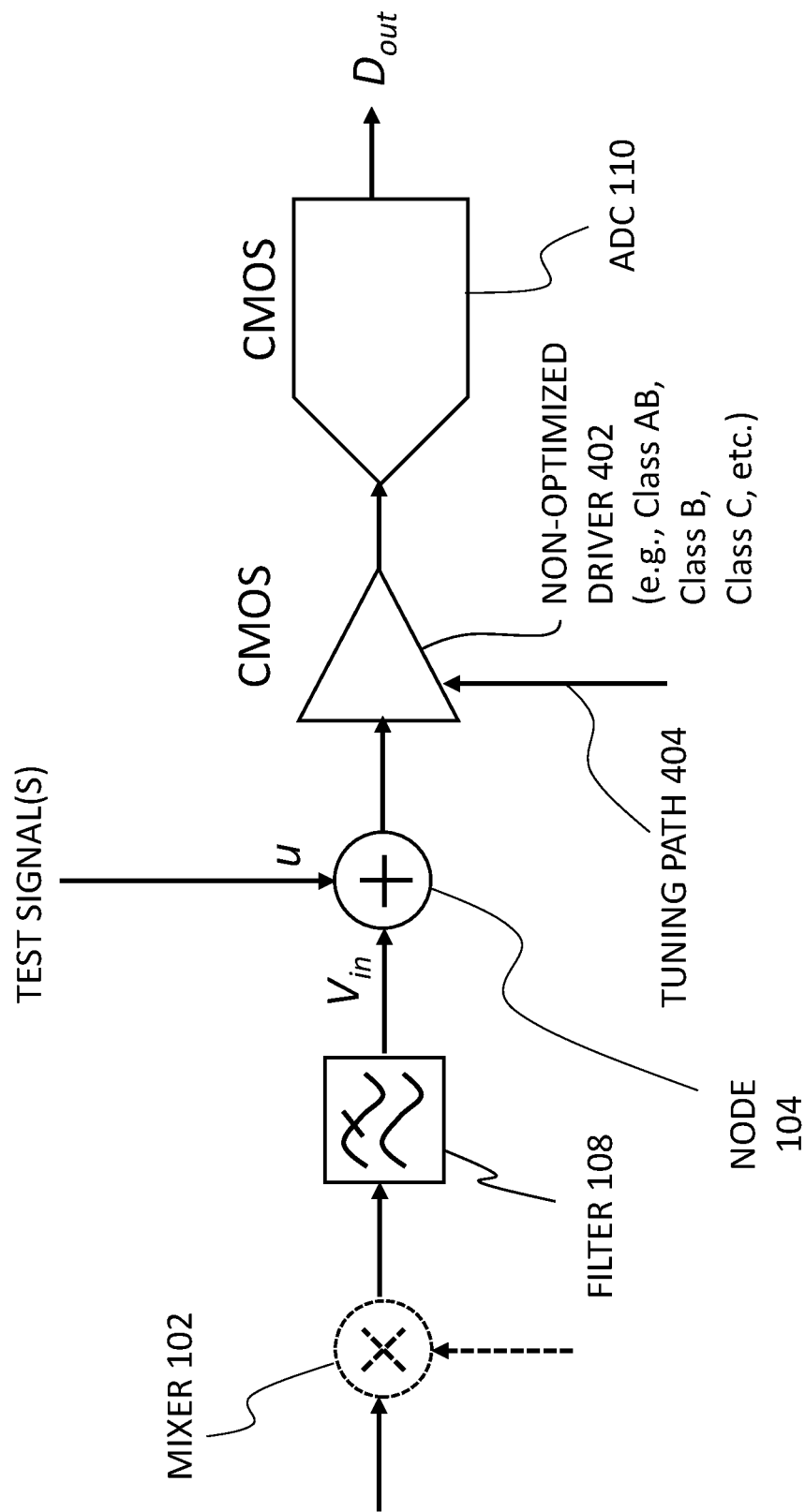
FIG. 4 illustrates another exemplary input circuitry driving an ADC, according to some embodiments of the disclosure.

With optimization circuitry 120, a BiCMOS driver can be replaced by (lower linearity) CMOS drivers that can reside on the same CMOS die as the ADC 110 without compromising the net degradation in linearity and performance. FIG. 4 illustrates another exemplary input circuitry driving an ADC 110, according to some embodiments of the disclosure. The input circuitry includes a non-optimized driver 402. In some embodiments, the non-optimized driver 402 can include a Class AB, Class B, or Class C amplifier. Far less linear, but more power efficient, amplifier architectures can be implemented for the non-optimized driver 402, since the linearity of the non-optimized driver 402 is no longer a factor limiting the design of the input circuitry of the receiver signal chain. Specifically, the non-optimized driver 202 and the ADC 110 are fabricated in CMOS technology. Non-optimized driver 402 eliminates BJTs and uses CMOS transistors only to implement the non-optimized driver 402. Node 104 allows for one or more test signals to be injected in front of the input circuitry. In this example, node 104 is in front of non-optimized driver 402. In some cases, node 104 can be in front of filter 108. In some other cases, node 104 can be in front of mixer 102. Optimization circuitry (not shown fully in the FIGURE) can observe samples of the digital output $D_{out}$ to extract and compensate for properties of the input circuitry, including the non-idealities of the non-optimized driver 402.

Using a CMOS amplifier architecture for non-optimized driver 402, the non-optimized driver can be integrated and implemented in the same die with the ADC 110. In some cases, integrating the non-optimized driver 402 can complement an on-chip buffer or eliminate the need for the on-chip buffer in front of ADC 110.

Besides having benefits of higher functional integration of the receiver signal chain (e.g., reducing board space and manufacturing cost), integrating the non-optimized driver 402 with ADC 110 onto a same die reduces the strays that would have existed between an off-chip BiCMOS driver and its load (the ADC 110). These strays can often cause degradation in linearity in the receiver signal chain, even when the BiCMOS driver and its load are individually designed to have optimal linearity and performance. Having the non-optimized driver 402 and the ADC 110 both in CMOS means that the CMOS buffer and the front-end circuitry of the ADC 110 are now connected by substantially smaller and more controllable die interconnects. Integration of the non-optimized driver 402 thus provide unexpected added benefits in performance of a receiver signal chain by eliminating the strays that would have existed between an off-chip BiCMOS driver and its load (i.e., the ADC 110).

Yet another benefit to integration is the ability to more easily tune/control the non-optimized driver 402, as illustrated by tuning path 404. The non-optimized driver 402 may be tuned in the analog domain to compensate for properties of the input circuitry. The non-optimized driver 402 may be tuned in the analog domain to adjust its gain. Integrating the non-optimized driver 402 with ADC 110 means that serial peripheral interfaces that would have existed for controlling a driver residing on a different die can be eliminated. As a result, the non-optimized driver 402 can be tuned/controlled more efficiently. In some cases, the non-optimized driver 402 can be tuned/controlled more effectively in real time (e.g., within automatic gain control loops) when cumbersome data interfaces are eliminated.

Figure 5:
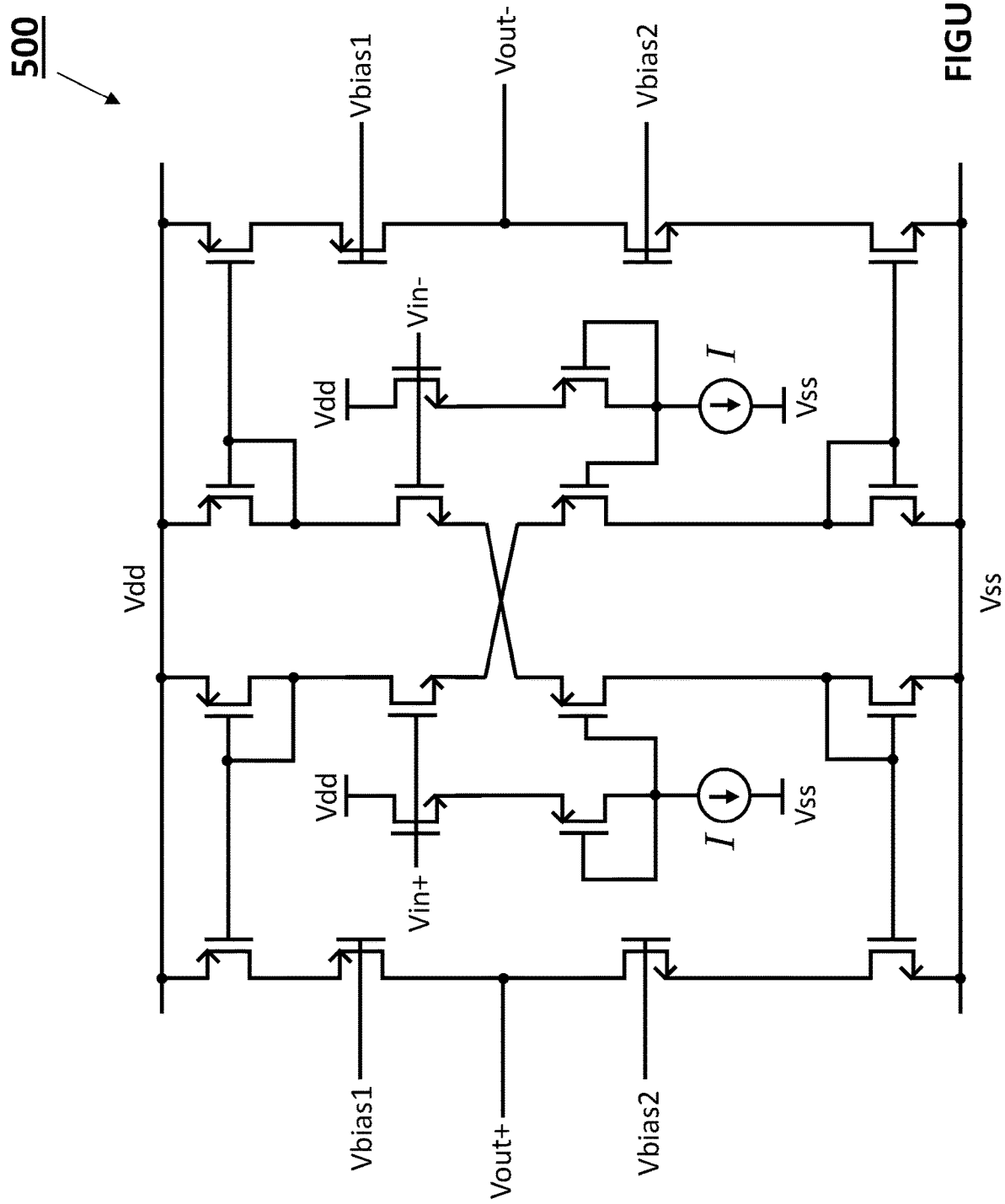
FIG. 5 shows another exemplary non-optimized driver, according to some embodiments of the disclosure.

FIG. 5 shows another exemplary non-optimized driver, according to some embodiments of the disclosure. Circuit 500 is full CMOS version of the BiCMOS circuit 300 (Class AB amplifier) seen in FIG. 3. The input transistor devices implemented with BJTs in circuit 300 are replaced with NMOS (N-type metal-oxide-semiconductor) transistor devices. Such a Class AB CMOS amplifier can be implemented as the non-optimized driver 402 and integrated on the same die with the ADC 110 as illustrated in FIG. 4. The resulting receiver signal chain can be optimized to address the non-idealities of using a Class AB CMOS amplifier being implemented as the non-optimized driver 402.

Figure 6:
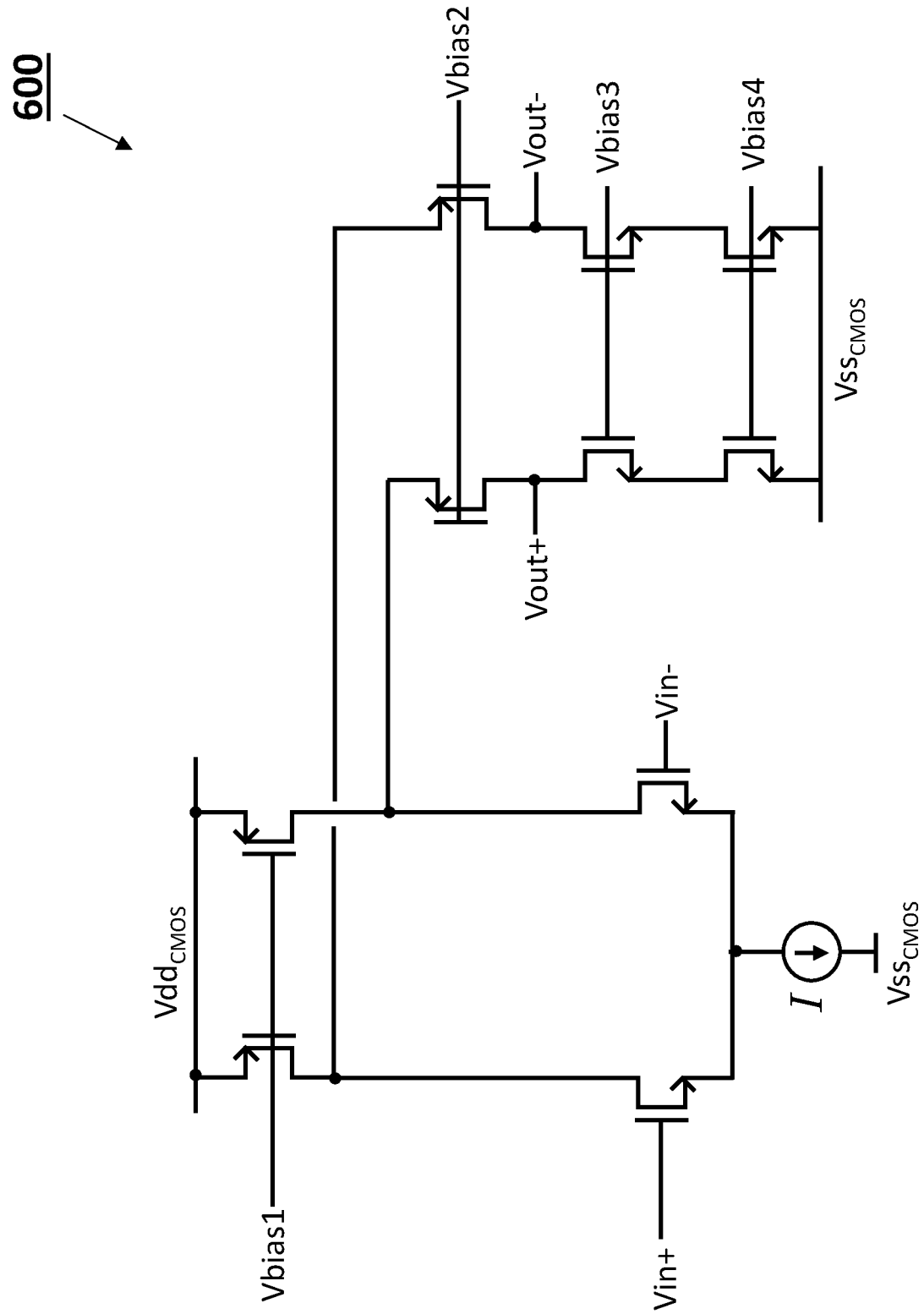
FIG. 6 shows yet another exemplary non-optimized driver, according to some embodiments of the disclosure.

FIG. 6 shows yet another exemplary non-optimized driver, according to some embodiments of the disclosure. Circuit 600 is a full CMOS Class AB amplifier, having a folded cascode amplifier architecture. Such a Class AB CMOS amplifier can be implemented as the non-optimized driver 402 and integrated on the same die with the ADC 110 as illustrated in FIG. 4. The resulting receiver signal chain can be optimized to address the non-idealities of the Class AB CMOS amplifier being implemented as the non-optimized driver 402. Circuit 600 can be particularly amendable to the lower supplies of nanometer CMOS technologies.

In some embodiments, the ADC 110 is a radio-frequency (RF) sampling ADC. RF sampling ADC can process analog signals at speed, and thus can remove the need for a mixer in the receiver signal chain. As a result, the receiver signal chain is further simplified and can enable even higher level of integration of function blocks in the receiver signal chain.

Eliminating Baluns in the Receiver Signal Chain

High speed ADCs often require a differential input, and a driver with a single-ended output would typically drive a balun in order to output a differential signal for the high speed ADC. Baluns convert the single-ended output from the driver into a differential signal without adding distortion or noise to the receiver signal chain. Under certain input conditions, baluns can often perform better than drivers that output a differential signal.

Figure 7:
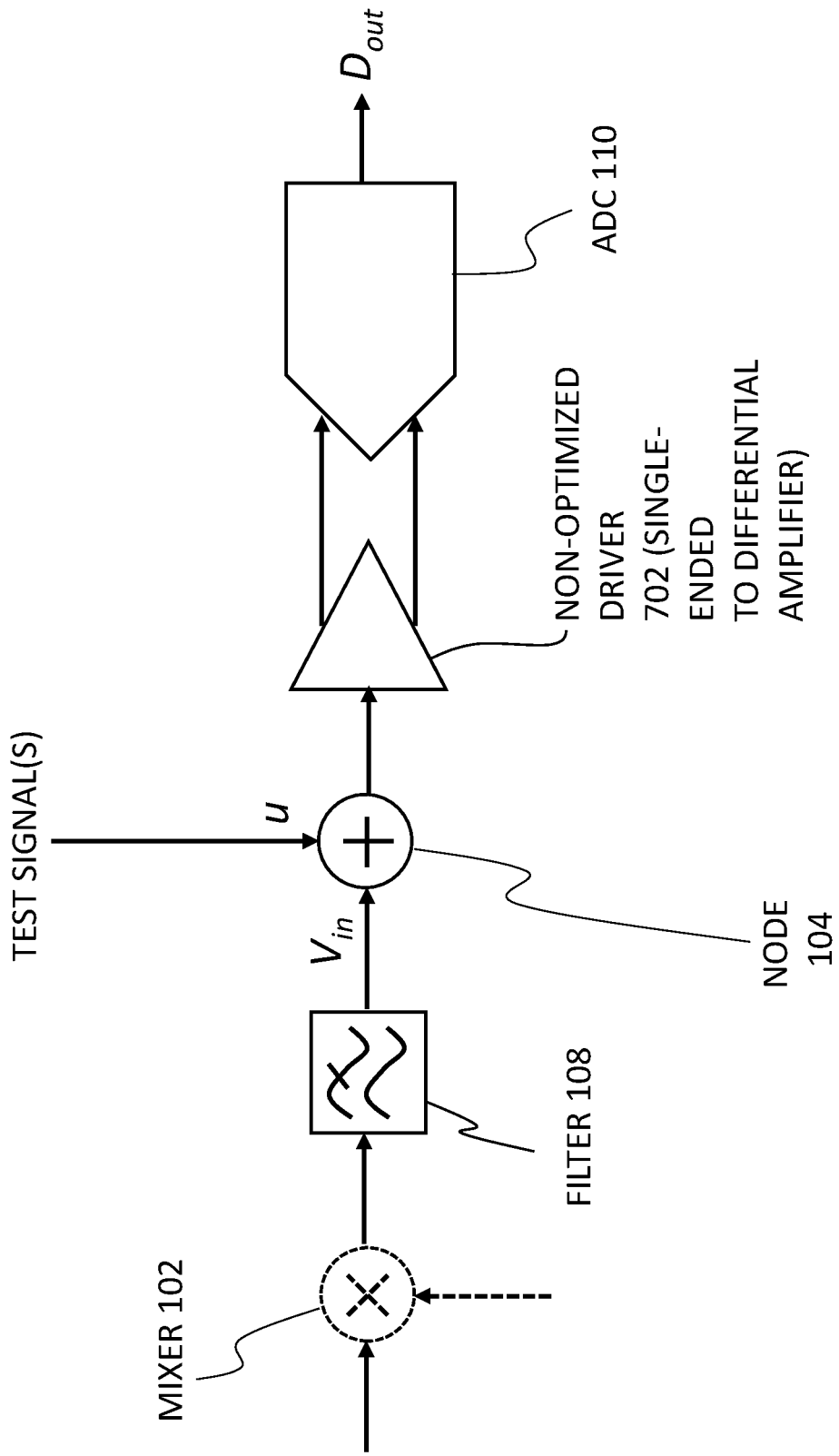
FIG. 7 illustrates yet another exemplary input circuit driving an ADC, according to some embodiments of the disclosure.

FIG. 7 illustrates yet another exemplary input circuit driving an ADC 110, according to some embodiments of the disclosure. Node 104 allows one or more test signals to be injected in front of the input circuitry. The input circuitry includes a non-optimized driver 702, which is implemented using a single-ended to differential amplifier. ADC 110 receives a differential input. While a single-ended to differential amplifier may not have the same linearity and performance as a fully differential amplifier or a single-ended output amplifier driving a balun, the requirement on linearity of the input circuitry is no longer a limiting factor in designing the receiver signal chain. Accordingly, the input circuitry can implement a single-ended to differential amplifier as the non-optimized driver 702. Optimization circuitry (not shown fully in the FIGURE) can observe samples of the digital output $D_{out}$ to extract and compensate for properties of the input circuitry, including the non-idealities of the non-optimized driver 702.

Exemplary Non-Optimized Drivers

In some cases, the non-optimized driver in the input circuitry are implemented with an amplifier, meaning, the gain of the non-optimized driver is greater than unity or 1. Having a gain greater than 1 means that a small input signal can be amplified to fit an input range of the ADC. For example, the amplifier can be a Class AB, Class B, or Class C amplifier. The amplifier can be closed into a feedback loop to perform the driving function.

Figure 8:
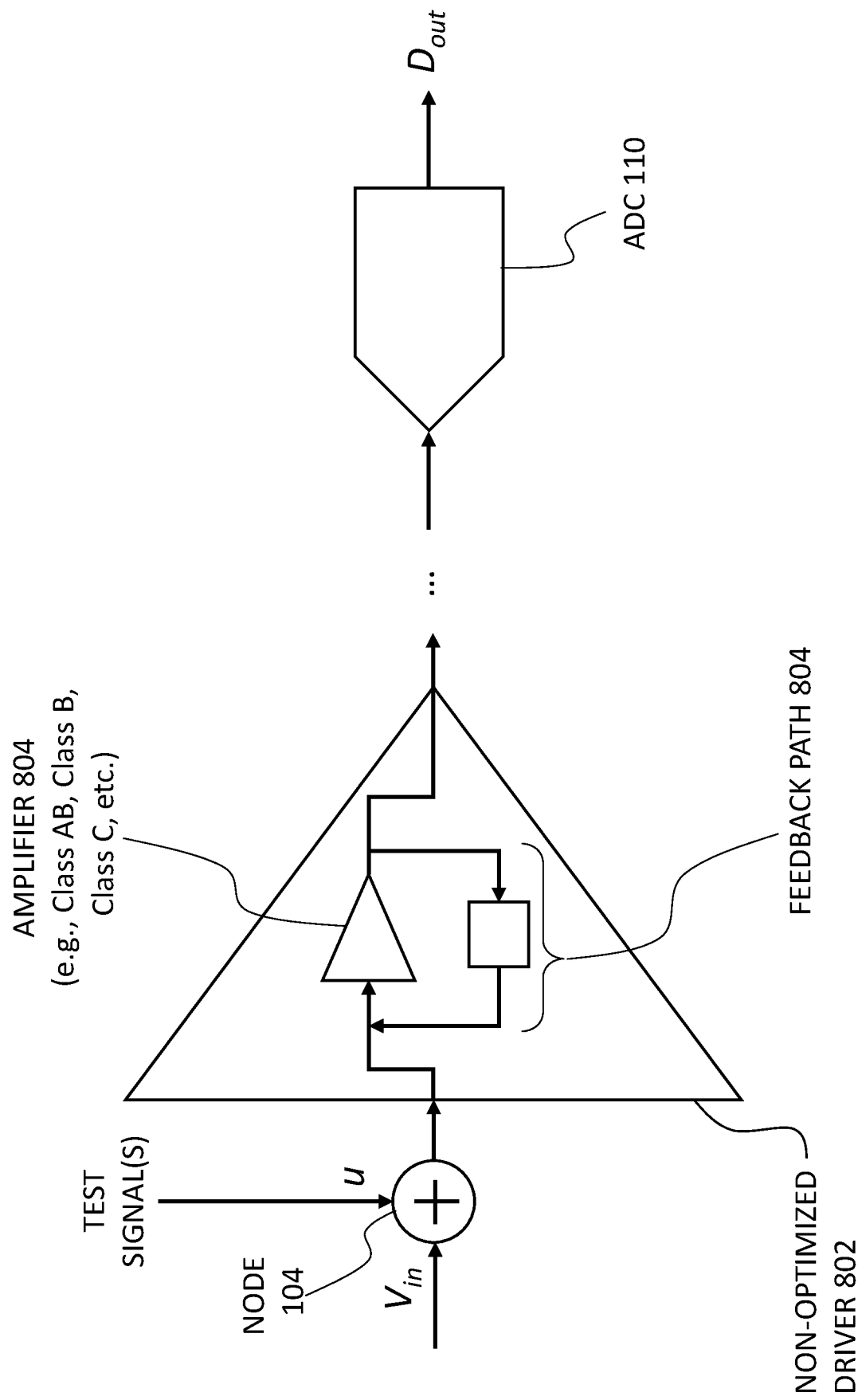
FIGS. 8-11 illustrate exemplary non-optimized drivers, according to some embodiments of the disclosure.

FIG. 8 shows an exemplary non-optimized driver 802 that is closed into a feedback loop, according to some embodiments of the disclosure. The non-optimized driver 802 comprises an amplifier 804, which can be a Class AB, Class B, or Class C amplifier. The amplifier 804 can have a corresponding gain (e.g., open-loop gain). The non-optimized driver 802 has a feedback path from an output of the amplifier 804 to an input of the amplifier 804. The feedback path can have a corresponding gain (e.g., feedback factor). In some cases, the amplifier 804 has a gain that is greater than unity or 1, and the amplifier 804 is closed into unity gain feedback, where the corresponding gain of the feedback path is 1.

Figure 9:
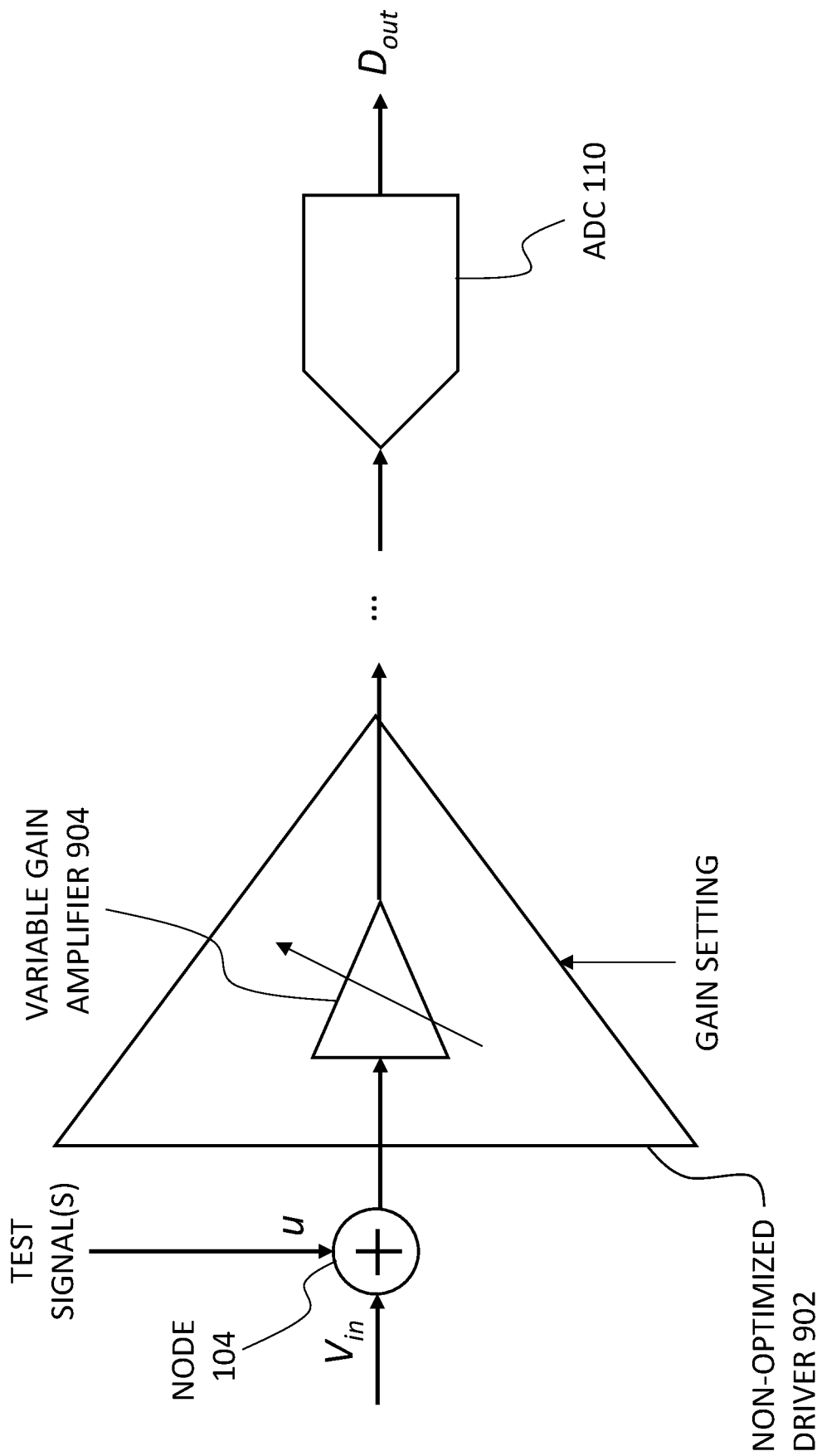

FIG. 9 shows an exemplary non-optimized driver 902 with variable gain, according to some embodiments of the disclosure. The non-optimized driver 902 includes a variable gain amplifier 904. A gain setting can be provided to control a gain of the variable gain amplifier 904. The behavior of the input circuitry when the input circuitry has a variable gain amplifier 904 can change depending on the gain setting. When the gain of the non-optimized driver 902 changes, the model parameters C of the input circuitry can also change. Accordingly, the input frequency-dependent properties of the input circuitry and amplitude-dependent properties of the input circuitry can change depending on, or be dependent on a gain setting of the variable gain amplifier 904. When a specific gain setting is used for the variable gain amplifier 904, the correction circuitry 120 of FIG. 1 can apply input frequency-dependent properties of the input circuitry and amplitude-dependent properties of the input circuitry corresponding to the specific gain setting. In some cases, one set of model parameters $C_1$ of the input circuitry can be extracted for a particular gain setting, and a different set of model parameters $C_2$ can be extracted separately for a different gain setting. For different gain settings, different sets of model parameters $C_1, C_2 \ldots$, can be extracted and applied by the correction circuitry 120.

Figure 10:
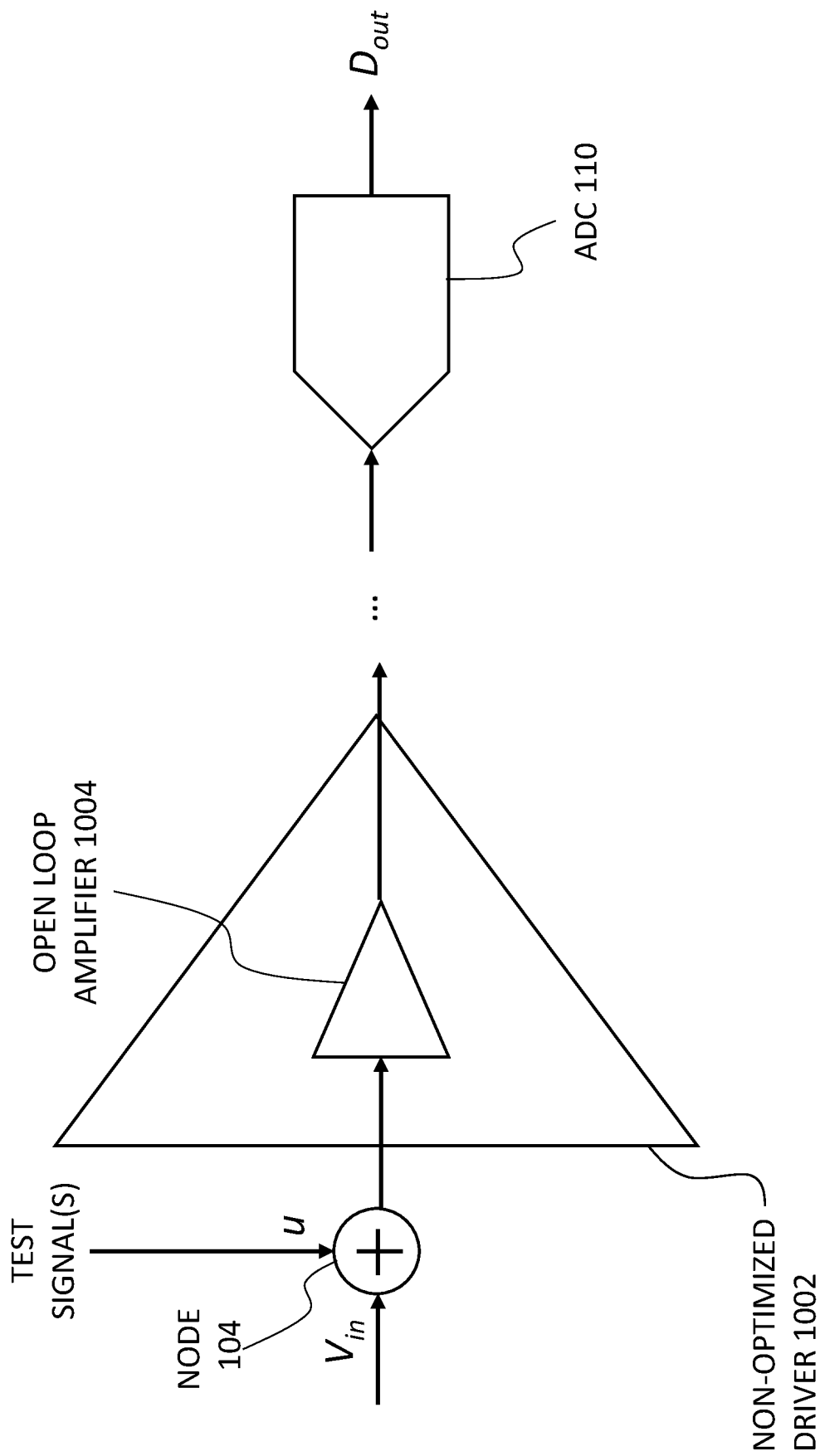

FIG. 10 shows an exemplary non-optimized driver 1002 that includes an open-loop amplifier 1004, according to some embodiments of the disclosure. Open-loop amplifier 1004 is not closed into a feedback loop. Open-loop amplifier 1004 is not necessarily well controlled over process, voltage, and temperature variations. However, the optimization circuitry described herein can be used to correct for the non-idealities of the open-loop amplifiers. One example of an open-loop amplifier 1004 is a common emitter amplifier (in single-ended form, pseudo-differential form, or differential form). In some cases, the open-loop amplifier 1004 has a source degeneration resistor for implied feedback.

Figure 11:
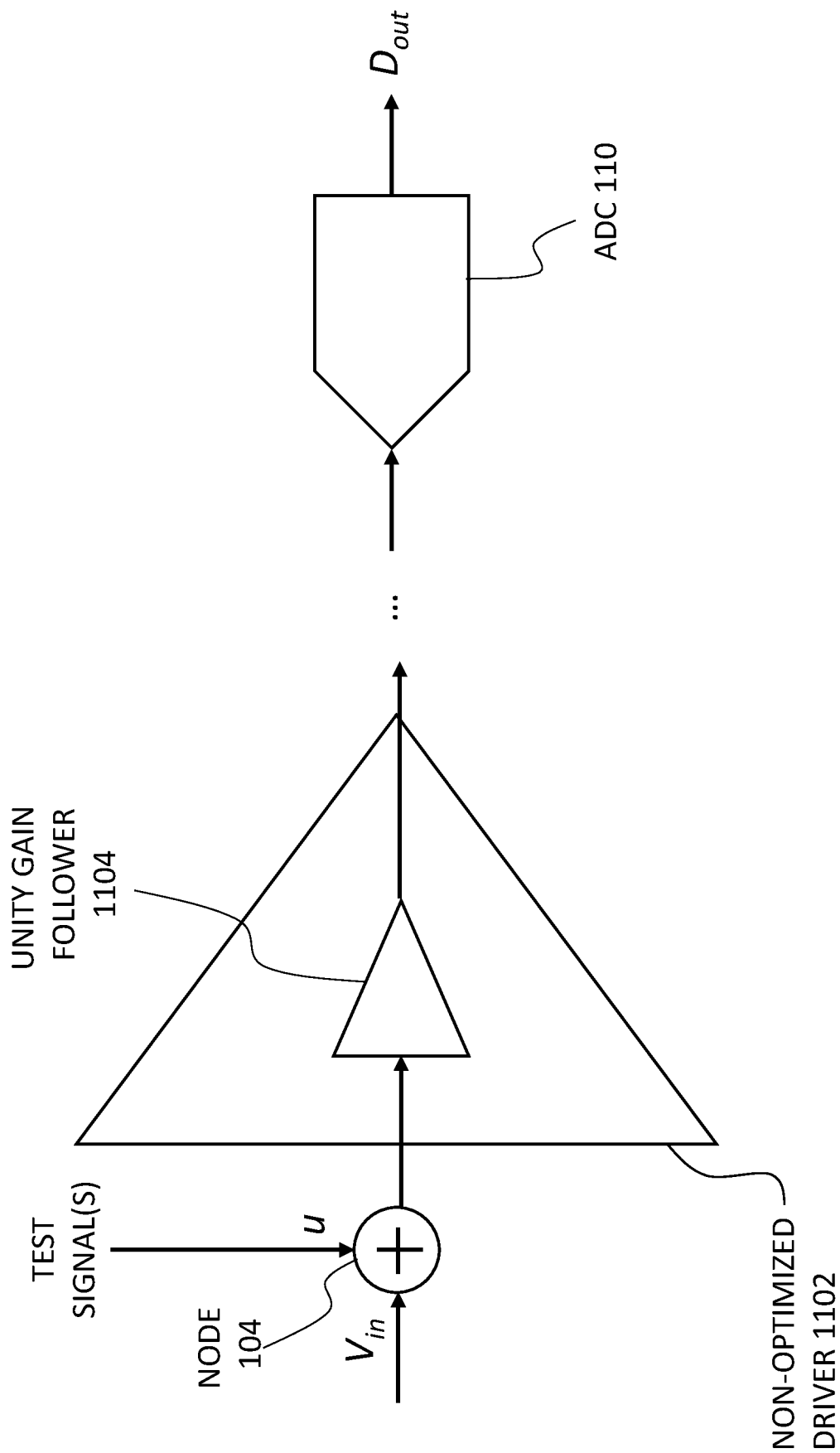

FIG. 11 shows an exemplary non-optimized driver 1102 that includes a unity gain follower 1104, according to some embodiments of the disclosure. The unity gain follower 1104 can include an emitter follower (if the unity gain follower 1104 is implemented with BJTs). The unity gain follower 1104 can include a source follower (if the unity gain follower 1104 is implemented in CMOS). The unity gain follower 1104 can include a push-pull circuit and level shifter(s) to shift an input signal or a derived input signal to drive the transistor devices in the push-pull circuit. The unity gain follower 1104 can be in single-ended form, pseudo-differential form, or differential form. The unity gain follower 1104 can be implemented to have Class AB, Class B, or Class D operation.

The examples illustrated by FIGS. 8-11 can include a Class AB, Class B, Class C, or Class D amplifier, fabricated in BiCMOS technology to reduce power consumption. Class D operation means that the amplifying transistor devices in the non-optimized driver operate as switches and not as linear gain devices. The examples illustrated by FIGS. 8-11 can include Class AB, Class B, Class C, or Class D amplifier, fabricated in CMOS technology to reduce power consumption and enable higher integration of the non-optimized driver with the rest of the receiver signal chain. The examples illustrated by FIGS. 8-11 can suffer from non-idealities, but the examples can include architecturally more desirable non-optimized drivers for reasons such as lower power consumption, lower complexity, and higher integration. The optimization circuitry described herein can advantageously, correct for the non-idealities of the non-optimized driver, so that the use of such architecturally more desirable non-optimized drivers would not significantly degrade the overall performance of the receiver signal chain.

Method for Optimizing a Receiver Signal Chain

FIG. 12 is a flow diagram illustrating a method for optimizing a receiver signal chain, according to some embodiments of the disclosure. The receiver signal chain has input circuitry driving an ADC. The input circuitry has a non-optimized driver. In 1202, one or more test signals are injected in front of the input circuitry during a period of time when an input signal to the input circuitry is not present. The one or more test signals can be injected at node 104 in the FIGURES. In some embodiments, the non-optimized driver and the ADC are fabricated in CMOS technology. In 1204, one or more of: input frequency-dependent properties of the input circuitry and amplitude-dependent properties of the input circuitry are extracted based on samples of an output of the ADC. The input frequency-dependent properties are properties that vary as a non-constant or non-linear function of input signal frequency. The amplitude-dependent properties are properties that vary as a non-constant or non-linear function of input amplitude. Optimization circuitry 120 of FIG. 1 can be effective in extracting the input frequency-dependent properties and amplitude-dependent properties. In 1206, a digital filter (e.g., correction circuitry 130 of FIG. 1) filtering the output of the ADC is configured based on one or more of: the input frequency-dependent properties and the amplitude-dependent properties.

In some embodiments, injecting one or more test signals comprises controlling a DAC on a same substrate as the ADC to output one or more of: tones having respective frequencies spread across one or more Nyquist zones of the ADC, and a wideband signal spread across a range of frequencies. Injecting one or more test signals spanning a range of frequencies enable input frequency-dependent non-linearities of the input circuitry and amplitude-dependent non-linearities of the input circuitry to be extracted. Having a DAC on the same substrate as the ADC means that the overall receiver signal chain can optimize in-situ, and additional external circuitry is not required.

EXAMPLES

Example 1 is a receiver signal chain with digitally-assisted optimization, comprising: input circuitry comprising a non-optimized driver to receive an input signal, wherein the non-optimized driver includes a Class AB, Class B, or Class C amplifier; an analog-to-digital converter (ADC) downstream of the input circuitry; a node to inject one or more test signals in front of the input circuitry; digital circuitry to derive one or more parameters of the input circuitry from samples of an output of the ADC generated from injecting the one or more test signals; and circuitry to optimize the input circuitry based on the one or more parameters.

In Example 2, the receiver signal chain of Example 1 can optionally include the circuitry comprising correction circuitry downstream of the ADC to digitally correct the output of the ADC based on the one or more parameters.

In Example 3, the receiver signal chain of Example 1 or 2 can optionally include the circuitry comprising tuning path to adjust the input circuitry in an analog domain based on the one or more parameters.

In Example 4, the receiver signal chain of any one of Examples 1-3 can optionally include the node to inject the one or more test signals injecting the one or more test signals when the input circuitry is not receiving the input signal.

In Example 5, the receiver signal chain of any one of Examples 1-4 can optionally include the one or more parameters varying as a non-constant function of one or more of: input signal frequency and input signal amplitude.

In Example 6, the receiver signal chain of any one of Examples 1-5 can optionally include a digital-to-analog converter, in a same chip package as the non-optimized driver and the ADC, to generate the one or more test signals.

In Example 7, the receiver signal chain of any one of Examples 1-6 can optionally include the one or more test signals comprising tones having respective frequencies spread across a range of frequencies.

In Example 8, the receiver signal chain of any one of Examples 1-7 can optionally include the one or more test signals comprising a wideband signal spread across a range of frequencies.

In Example 9, the receiver signal chain of any one of Examples 1-8 can optionally include the non-optimized driver being fabricated in a semiconductor technology that integrates bipolar junction transistors and complementary metal-oxide-semiconductor transistor, and the ADC is fabricated in complementary metal-oxide-semiconductor technology.

In Example 10, the receiver signal chain of any one of Examples 1-8 can optionally include the non-optimized driver and the ADC are fabricated in complementary metal-oxide-semiconductor technology.

Example 11 is a receiver signal chain with digitally-assisted optimization, comprising: input circuitry to receive an input signal, the input circuitry comprising a non-optimized driver; an analog-to-digital converter (ADC) downstream of the input circuitry, wherein the non-optimized driver and the ADC are fabricated in complementary metal-oxide-semiconductor technology; a node to inject one or more test signals in front of the input circuitry; digital circuitry to derive one or more of: input frequency-dependent properties of the input circuitry and amplitude-dependent properties of the input circuitry, from output samples of the ADC generated from injecting the one or more test signals; and correction circuitry downstream of the ADC to digitally correct the output based on the one or more of: input frequency-dependent properties and amplitude-dependent properties.

In Example 12, the receiver signal chain of Example 11 can optionally include the one or more test signals being injected when the one or more test signals are not interfering with the input signal.

In Example 13, the receiver signal chain of Example 11 or 12 can optionally include the non-optimized driver having a Class AB, Class B, or Class C amplifier.

In Example 14, the receiver signal chain of Claim 13, wherein the non-optimized driver has a feedback path from an output of the Class AB, Class B, or Class C amplifier to an input of the Class AB, Class B, or Class C amplifier.

In Example 15, the receiver signal chain of Example 11 or 12 can optionally include the non-optimized driver having a Class D amplifier.

In Example 16, the receiver signal chain of any one of Examples 11-15 can optionally include the non-optimized driver having a variable gain amplifier.

In Example 17, the receiver signal chain of Example 16 can optionally include the input frequency-dependent properties of the input circuitry and amplitude-dependent properties being dependent on a gain setting of the variable gain amplifier.

In Example 18, the receiver signal chain of any one of Examples 11-13, and 16-17 can optionally include the non-optimized driver having an open-loop amplifier.

In Example 19, the receiver signal chain of any one of Examples 11-18 can optionally include the non-optimized driver having a unity gain follower.

In Example 20, the receiver signal chain of any one of Examples 11-19 can optionally include the non-optimized driver including a single-ended input to differential output amplifier; and the ADC is to receive a differential input.

In Example 21, the receiver signal chain of any one of Examples 11-20 can optionally include a digital-to-analog converter in a same chip package as the non-optimized driver and the ADC to generate the one or more test signals.

In Example 22, the receiver signal chain of any one of Examples 11-21 can optionally include the one or more test signals comprising tones having respective frequencies spread across one or more Nyquist zones of the ADC.

In Example 23, the receiver signal chain of any one of Examples 11-23 can optionally include the one or more test signals comprising the one or more test signals comprises a wideband signal spread across a range of frequencies.

In Example 24, the receiver signal chain of any one of Examples 11-24 can optionally include the ADC being a radio-frequency sampling ADC.

Example 25 is a method for optimizing a receiver signal chain having input circuitry driving an analog-to-digital converter (ADC), the input circuitry comprising a non-optimized driver, the method comprising: injecting one or more test signals in front of the input circuitry during a period of time when an input signal to the input circuitry is not present, wherein the non-optimized driver and the ADC are fabricated in complementary metal-oxide-semiconductor technology; extracting one or more of: input frequency-dependent properties of the input circuitry and amplitude-dependent properties of the input circuitry, based on samples of an output of the ADC; and configuring a digital filter filtering the output of the ADC based on one or more of: the input frequency-dependent properties and the amplitude-dependent properties.

In Example 26, the method of Example 25 can optionally include processing the output of the ADC by the digital filter to generate a corrected output.

In Example 27, the method of Example 25 or 26 can optionally include injecting one or more test signals comprising: controlling a digital-to-analog converter (DAC) on a same substrate as the ADC to output one or more of: tones having respective frequencies spread across one or more Nyquist zones of the ADC, and a wideband signal spread across a range of frequencies.

In Example 28, the method of any one of Examples 25-27 can optionally include the input frequency-dependent properties varying as a non-constant function of a frequency of the input signal.

In Example 29, the method of any one of Examples 25-28 can optionally include the amplitude-dependent properties vary as a non-constant function of an amplitude of the input signal.

Example 30 is an apparatus comprising means to carry out any one or more of: methods described herein and methods in Examples 25-29.

Variations and Implementations

Herein, "non-linearities" and "non-idealities" are used interchangeably. Errors resulting from the non-linearities can depend on input signal frequency, input signal amplitude, clock rate, temperature, voltage supply, etc.

Embedded input buffers provided on-chip with the ADC are not to be construed as the non-optimized drivers referenced herein. Those embedded input buffers are usually Class A amplifiers (i.e., optimized buffers which are not very power efficient). Moreover, those embedded input buffers are limited in their ability to provide isolation, and they are mostly effective at lower frequency, with diminishing effectiveness at higher frequency.

The optimization techniques described herein may seem similar to digital pre-distortion schemes to achieve linearity of signal chain, but, the embodiments described herein for linearization are distinguishable from such schemes. Digital pre-distortion schemes pre-distort digital data that is being used to drive a signal chain to achieve linearity. These schemes typically would have knowledge of the input data into the signal chain (i.e., digital data as input to the signal chain), and pre-distort it based on an inverse of non-linear functions of the signal chain to achieve linearity. In contrast, the embodiments described herein do not assume that there is any knowledge of the input signal (e.g., typically an unknown analog input signal being fed as input to the signal chain). Moreover, the embodiments described herein offer digital correction or analog tuning to correct and address the non-linearities of the signal chain, which is not the same as pre-distorting a digital signal.

The present disclosure describes many embodiments related to providing circuitry which are on-chip with the ADC. On-chip can mean that the circuitry and the ADC are on the same die. On-chip can mean that the circuitry and the ADC are on provided on the same semiconductor substrate. In some cases, the circuitry and the ADC are vertically integrated together where different parts of the integrated circuit are provide on different sides or on different layers of a three-dimensional/horizontally/vertically integrated circuit with a through-silicon via (TSV) and/or silicon interposers connecting the different parts. In some embodiments, the on-chip circuitry is provided with the same chip package as the ADC, but not necessarily on the same semiconductor substrate. Note that particular embodiments of the present disclosure may be readily included in a system on-chip (SOC) package, either in part, or in whole. An SOC represents an integrated circuit that integrates components of an electronic system into a single chip package. It may contain digital, analog, mixed-signal, and converter functions (or some other desired functions): all of which may be provided on top of a single chip substrate. Other embodiments may include a multi-chip-module (MCM), with a plurality of separate integrated circuits located within a single electronic package and configured to interact closely with each other through the electronic chip package.

The chip having some function blocks of the receiver signal chain may be programmed with pre-determined coefficients used for optimizing the input circuitry, where the pre-determined coefficients are determined with a tester. After the chip is shipped, the optimization circuitry 120 can run to update the pre-determined coefficients.

ADCs can be found in many places such as broadband communication systems, audio systems, receiver systems, etc. ADCs can translate analog electrical signals representing real-world phenomenon, e.g., light, sound, temperature, or pressure for data processing purposes. Designing an ADC is a non-trivial task because each application may have different needs in performance, power, cost, and size. ADCs are used in a broad range of applications including communications, energy, healthcare, instrumentation and measurement, motor and power control, industrial automation, and aerospace/defense.

In certain contexts, the features discussed herein can be applicable to converters being used in many different applications. The features described herein are particularly applicable to systems where performance (such as low power consumption and linearity) is important. Various exemplary applications include medical systems, scientific instrumentation, transportation systems, aerospace systems, wireless and wired communications, radar, industrial process control, audio and video equipment, consumer devices, and other converter-based systems.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for optimizing the input circuitry can include electronic circuitry to perform the functions described herein. In some cases, one or more parts of the apparatuses can be provided by an on-chip processor or controller specially configured for carrying out the functions described herein. For instance, the on-chip processor or controller may include one or more application specific components, or may include programmable logic gates which are configured to carry out the functions describe herein. The circuitry can operate in analog domain, digital domain, or in a mixed-signal domain (but preferably in the digital domain). In some instances, the processor or controller may be configured to carrying out the functions described herein by executing one or more instructions stored on a non-transitory computer medium accessible by the on-chip processor or controller.

In one example embodiment, the chip (or integrated circuit) having function blocks of the receiver signal chain and the on-chip processor may be provided on a board of an associated electronic device. The board can be a circuit board that can hold various components of the internal electronic system of the electronic device and, further, provide connectors for other peripherals. For instance, the chip having the converter and the on-chip processor can communicate with the components of the associated electronic device (e.g., signal generators, processors, memory, transmitters, receivers, etc.). More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, antennas, controllers for audio/video display, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the examples and appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the examples and appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the optimization functions, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. A receiver signal chain with digitally-assisted optimization, comprising:
   input circuitry comprising a non-optimized driver to receive an input signal, wherein the non-optimized driver includes a Class AB, Class B, or Class C amplifier;
   an analog-to-digital converter (ADC) downstream of the input circuitry;
   a node to inject one or more test signals in front of the input circuitry, when an input signal path to receive the input signal is decoupled from the input circuitry;
   digital circuitry to derive one or more parameters of the input circuitry from samples of an output of the ADC generated from injecting the one or more test signals; and
   circuitry to optimize the input circuitry based on the one or more parameters.

2. The receiver signal chain of claim 1, wherein the circuitry comprises correction circuitry downstream of the ADC to digitally correct the output of the ADC based on the one or more parameters.

3. The receiver signal chain of claim 1, wherein the circuitry comprises tuning path to adjust the input circuitry in an analog domain based on the one or more parameters.

4. The receiver signal chain of claim 1, wherein the node to inject the one or more test signals injects the one or more test signals when the input circuitry is not receiving the input signal.

5. The receiver signal chain of claim 1, wherein the one or more parameters vary as a non-constant function of one or more of: input signal frequency and input signal amplitude.

6. The receiver signal chain of claim 1, further comprising:
digital-to-analog converter, in a same chip package as the non-optimized driver and the ADC, to generate the one or more test signals.

7. The receiver signal chain of claim 1, wherein:
the one or more test signals comprises tones at evenly spaced frequencies spread over one or more Nyquist zones of the ADC; and
the digital circuitry derives the one or more parameters by observing magnitude and phase information of fundamental tones and harmonics in the samples of the output of the ADC.

8. The receiver signal chain of claim 1, wherein the one or more test signals comprises a wideband signal spread across a range of frequencies.

9. The receiver signal chain of claim 1, wherein:
the non-optimized driver is fabricated in a semiconductor technology that integrates bipolar junction transistors and complementary metal-oxide-semiconductor transistors; and
the ADC is fabricated in complementary metal-oxide-semiconductor technology.

10. The receiver signal chain of claim 1, wherein:
the non-optimized driver and the ADC are fabricated in complementary metal-oxide- semiconductor technology.

11. A receiver signal chain with digitally-assisted optimization, comprising:
input circuitry to receive an input signal, the input circuitry comprising a non-optimized driver;
an analog-to-digital converter (ADC) downstream of the input circuitry, wherein the non- optimized driver and the ADC are fabricated in complementary metal-oxide-semiconductor technology;
a node to couple a signal path receiving one or more test signals to the input circuitry, when an input signal path to receive the input signal is decoupled from the input circuitry;
digital circuitry to derive one or more of: input frequency-dependent properties of the input circuitry and amplitude-dependent properties of the input circuitry, from output samples of the ADC generated from injecting the one or more test signals; and
correction circuitry downstream of the ADC to digitally correct the output based on the one or more of: input frequency-dependent properties and amplitude-dependent properties.

12. The receiver signal chain of claim 11, wherein the one or more test signals are injected when the one or more test signals are not interfering with the input signal.

13. The receiver signal chain of claim 11, wherein the non-optimized driver includes a Class AB, Class B, or Class C amplifier.

14. The receiver signal chain of claim 11, wherein:
the non-optimized driver includes a single-ended input to differential output amplifier; and
the ADC is to receive a differential input.

15. The receiver signal chain of claim 11, further comprising:
digital-to-analog converter in a same chip package as the non-optimized driver and the ADC to generate the one or more test signals.

16. The receiver signal chain of claim 11, wherein the one or more test signals comprises tones at evenly spaced spread across one or more Nyquist zones of the ADC; and
the digital circuitry derives the one or more of: input frequency-dependent properties of the input circuitry and amplitude-dependent properties of the input circuitry, by observing magnitude and phase information of fundamental tones and harmonics in the output samples of the ADC.

17. The receiver signal chain of claim 11, wherein the one or more test signals comprises a wideband signal spread across a range of frequencies.

18. The receiver signal chain of claim 11, wherein the ADC is a radio- frequency sampling ADC.

19. The receiver signal chain of claim 11, wherein the non-optimized driver has a feedback path from an output of a Class AB, Class B, or Class C amplifier to an input of the Class AB, Class B, or Class C amplifier.

20. The receiver signal chain of claim 11, wherein the non-optimized driver comprises a Class D amplifier.

21. The receiver signal chain of claim 11, wherein the non-optimized driver comprises a variable gain amplifier.

22. The receiver signal chain of claim 21, wherein the input frequency-dependent properties of the input circuitry and amplitude-dependent properties are dependent on a gain setting of the variable gain amplifier.

23. The receiver signal chain of claim 11, wherein the non-optimized driver comprises an open-loop amplifier.

24. The receiver signal chain of claim 11, wherein the non-optimized driver comprises a unity gain follower.

25. A method for optimizing a receiver signal chain having input circuitry driving an analog-to-digital converter (ADC), the input circuitry comprising a non-optimized driver, the method comprising:
injecting one or more test signals in front of the input circuitry during a period of time when an input signal path receiving an input signal is decoupled from the input circuitry, wherein the non- optimized driver and the ADC are fabricated in complementary metal-oxide-semiconductor technology;
extracting input frequency-dependent properties of the input circuitry and amplitude- dependent properties of the input circuitry, based on samples of an output of the ADC; and
configuring a digital filter filtering the output of the ADC based on one or more of: the input frequency-dependent properties and the amplitude-dependent properties.

26. The method of claim 25, wherein:
injecting one or more test signals comprises controlling a digital-to-analog converter (DAC) on a same substrate as the ADC to output tones having respective frequencies spread across one or more Nyquist zones of the ADC.

27. The method of claim 25, wherein:
injecting one or more test signals comprises controlling a digital-to-analog converter (DAC) on a same substrate as the ADC to output a wideband signal spread across a range of frequencies.

28. The method of claim 25, wherein:
extracting the input frequency-dependent properties of the input circuitry and amplitude- dependent properties of the input circuitry comprises observing magnitude and phase information of fundamental tones and harmonics in the samples of the output of the ADC.

29. The method of claim 25, wherein:
the input frequency-dependent properties vary as a non-constant function of a frequency of the input signal.

30. The method of claim 25, wherein:
the amplitude-dependent properties vary as a non-constant function of an amplitude of the input signal.

31. The method of claim 25, further comprising:
processing the output of the ADC by the digital filter to generate a corrected output.

* * * * *